(12) United States Patent
Bürki et al.

(10) Patent No.: US 8,492,231 B2
(45) Date of Patent: Jul. 23, 2013

(54) NANOSCALE VARIABLE RESISTOR/ELECTROMECHANICAL TRANSISTOR

(75) Inventors: Jerome Alexandre Bürki, Pleasant Hill, CA (US); Charles Allen Stafford, Tucson, AZ (US); Daniel L. Stein, New York, NY (US)

(73) Assignees: Arizona Board of Regents on behalf of the University of Arizona, Tucson, AZ (US); New York University, New York, NY (US)

( * ) Notice: Subject to any disclaimer, the term of this patent is extended or adjusted under 35 U.S.C. 154(b) by 130 days.

(21) Appl. No.: 12/666,090

(22) PCT Filed: Jun. 25, 2008

(86) PCT No.: PCT/US2008/068224
§ 371 (c)(1),
(2), (4) Date: Jul. 14, 2011

(87) PCT Pub. No.: WO2009/003056
PCT Pub. Date: Dec. 31, 2008

(65) Prior Publication Data
US 2011/0260775 A1    Oct. 27, 2011

Related U.S. Application Data

(60) Provisional application No. 60/937,329, filed on Jun. 27, 2007.

(51) Int. Cl.
*H01L 21/336* (2006.01)
(52) U.S. Cl.
USPC ............ 438/284; 438/300; 977/762; 977/813

(58) Field of Classification Search
USPC .......................... 438/284, 300; 977/762, 813
See application file for complete search history.

(56) References Cited

U.S. PATENT DOCUMENTS

2006/0261419 A1   11/2006   Kreupl et al.
2009/0321176 A1*  12/2009   Cartwright et al. ........... 181/131

FOREIGN PATENT DOCUMENTS

WO     WO 2006/135336 A1    12/2006

OTHER PUBLICATIONS

Xiang et al., "Ge/Si nanowire heterostructures as high-performance field-effect transistors," Nature, May 25, 2006, pp. 489-493, vol. 441, No. 7092.
Zhang et al., "Parallel Core-Shell Metal-Dielectric-Semiconductor Germanium Nanowires for High-Current Surround-Gate Field-Effect Transistors", Nano Letters, Aug. 2006, pp. 2785-2789, vol. 6, No. 12.
International Search Report for WO 2009/003056 A3 dated Dec. 3, 2009.

* cited by examiner

*Primary Examiner* — Howard Weiss
*Assistant Examiner* — Steven Rao
(74) *Attorney, Agent, or Firm* — Foley & Lardner LLP

(57) ABSTRACT

A nanoscale variable resistor including a metal nanowire as an active element, a dielectric, and a gate. By selective application of a gate voltage, stochastic transitions between different conducting states, and even length, of the nanowire can be induced and with a switching time as fast as picoseconds. With an appropriate choice of dielectric, the transconductance of the device, which may also be considered an "electromechanical transistor," is shown to significantly exceed the conductance quantum $G0=2e^2/h$.

29 Claims, 14 Drawing Sheets

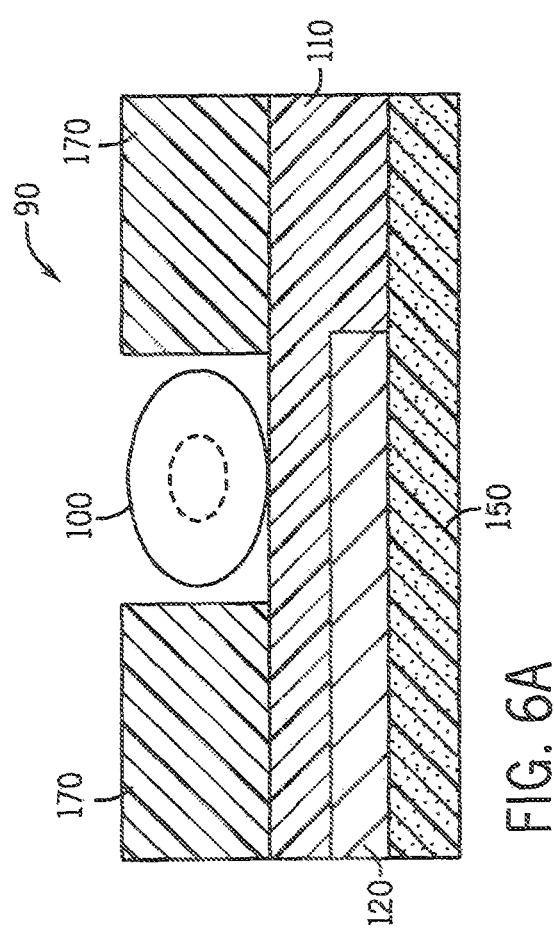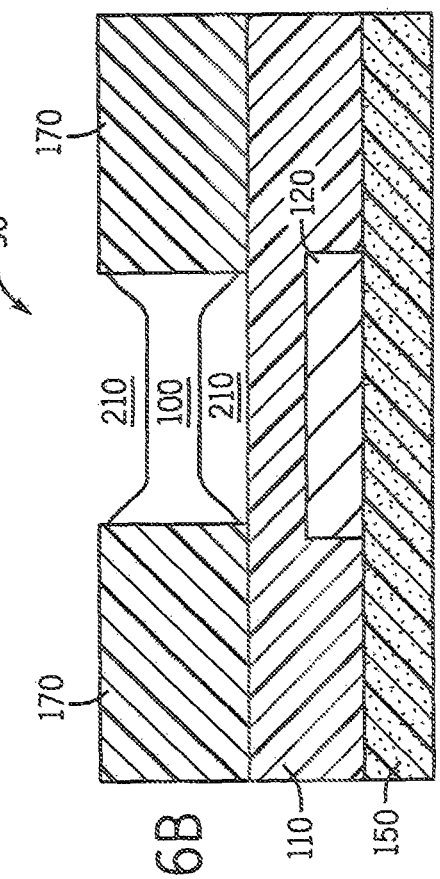

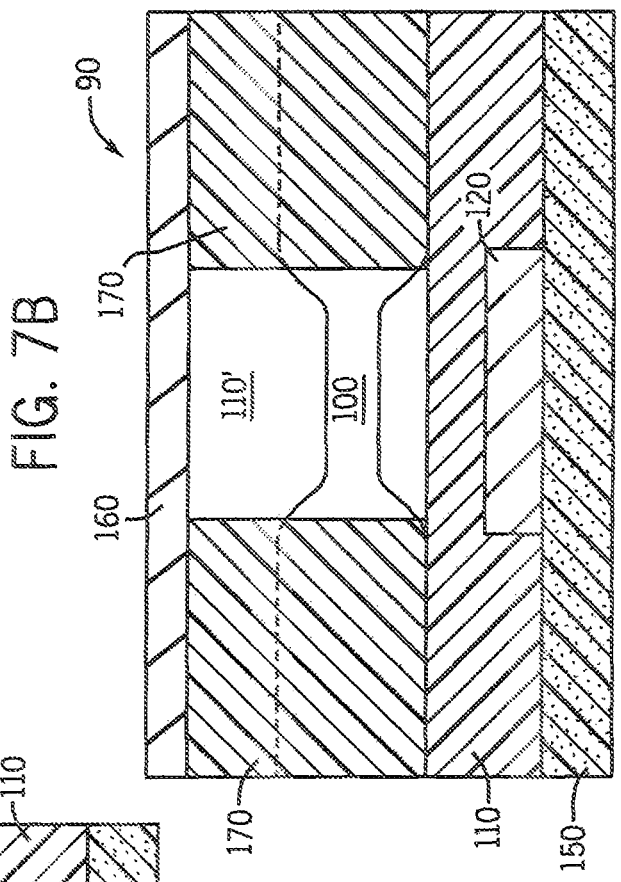
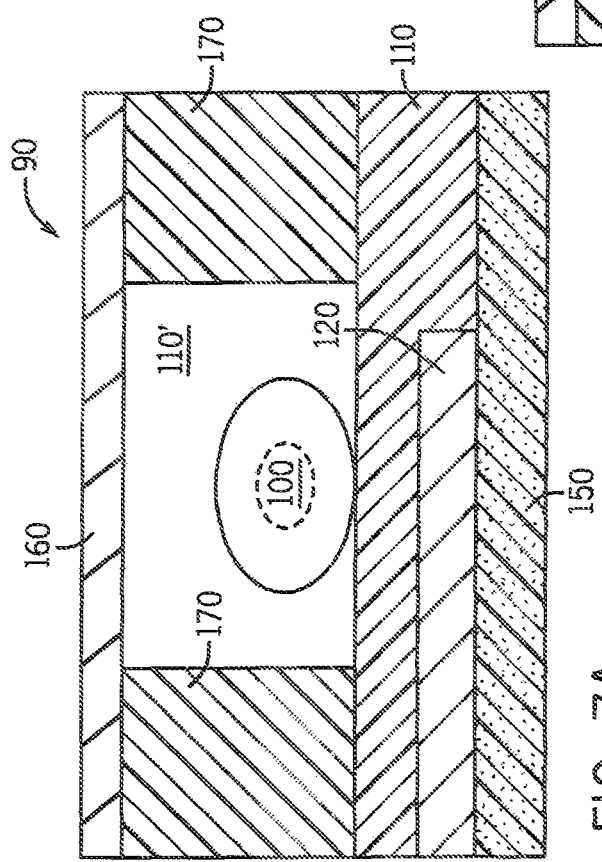
FIG. 7B
FIG. 7A

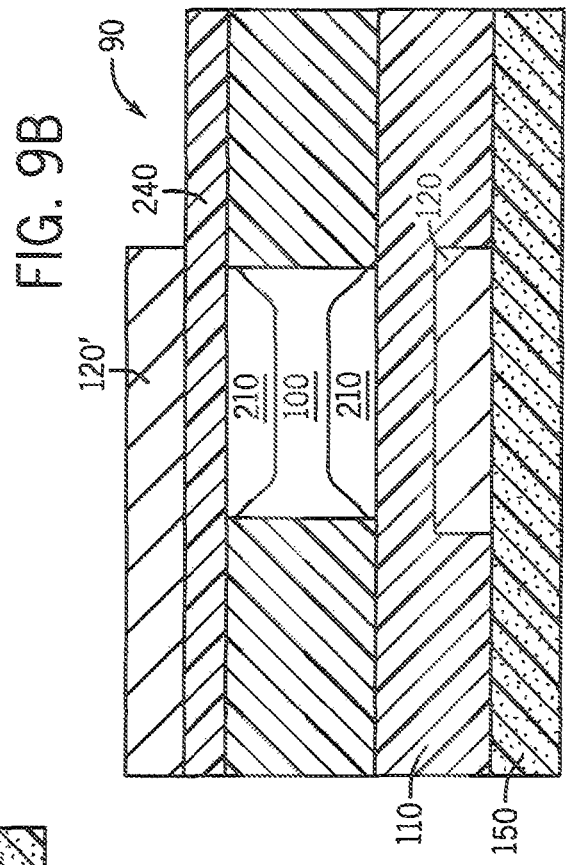
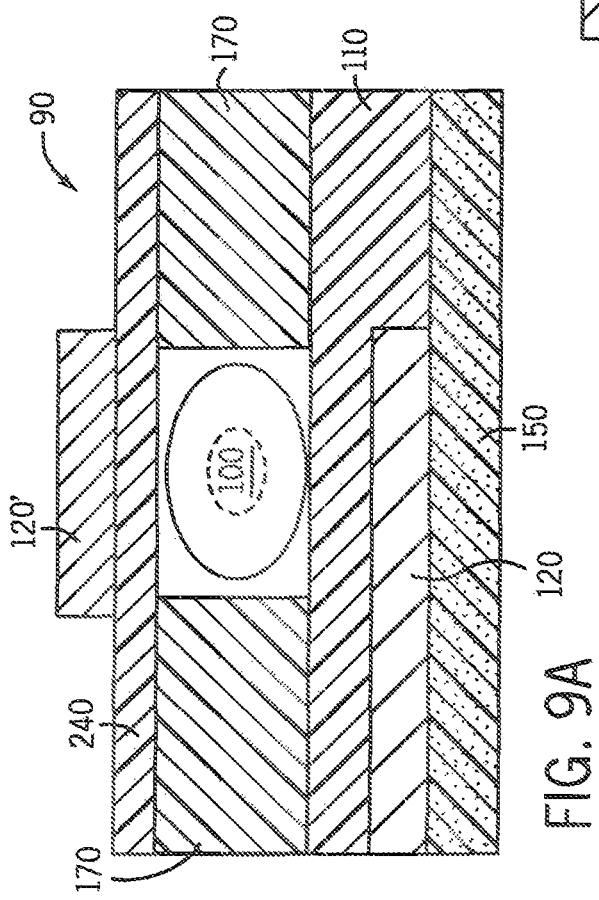

NANOSCALE VARIABLE RESISTOR/ELECTROMECHANICAL TRANSISTOR

This application claims the benefit of the filing date of U.S. Provisional Patent Application No. 60/937,329, filed Jun. 27, 2007, which is entirely incorporated by reference.

The U.S. Government has certain rights in this invention pursuant to NSF grant Numbers 0312038, PHY-0651077 and PHY-0601179.

This invention is directed toward a method and system for producing a nanoscale variable resistor. More particularly, the invention is directed to a nanoscale resistor comprised of an active metal nanowire, a dielectric and a gate. A voltage pulse from the gate enables a controlled stochastic transition between selectable conducting states of the nanowire and can be switched in the pico-second range.

BACKGROUND OF THE INVENTION

Metal nanowires have attracted considerable interest in the past decade due to their remarkable transport and structural properties. Gold and silver nanowires were observed to form spontaneously under electron irradiation, and appear to be stable. Even the thinnest gold wires, essentially chains of atoms, have been observed to exhibit lifetimes of the order of seconds at room temperature. Metal nanowires exhibit striking correlations between their stability and electrical conductance. Although not limiting the scope of the invention, the stability of filamentary structures can be explained by electron-shell effects. Because most of the atoms of a nanowire are at the surface, with low coordination numbers, metal nanowires behave essentially like fluids. Classically, the Rayleigh instability would break up any wire whose length exceeds its circumference. Nevertheless, nanowires violating the Rayleigh criterion have been observed. The instability is suppressed through quantum effects, with stabilization occurring through the nanowire's electronic shell structure. A quantum linear stability analysis showed the existence of "islands of stability" for discrete intervals of the radius R. These correspond to conductance "magic numbers" that agree with those observed in experiments. For low enough temperatures, there remain finite regions of R stable against long-wavelength perturbations. Therefore, stable wires exist only in the vicinity of certain "magic radii" and consequently at quantized conductance values G that are integer multiples of the conductance quantum $G_0=2e^2/h$. However, this linear stability analysis ignores large thermal fluctuations that can lead to breakup of the wire. Nanowire lifetimes are inferred from conductance histograms which are compiled by cycling a mechanically controllable break junction thousands of times. Prior art studies indicate that conductance peaks disappear above fairly well-defined temperatures.

The lifetimes of these nanowires have been studied in the art by using conventional techniques. By modeling thermal fluctuations through stochastic Ginzburg-Landau classical field theories, a self-consistent approach has been constructed to provide an explanation of the fluctuation-induced "necking" of nanowires that is in good agreement with prior art experiments. This theory indicates that passivated noble metal nanowires are sufficiently stable at room temperature to serve as interconnects between nanoscale circuit elements.

On the experimental side, nanowires with diameters less than a nanometer have been directly observed using transmission electron microscopes (TEM) to remain stable under low beam intensities below 5 A/cm$^2$ for the duration of observation. Stochastic switching between different conductance values has been observed in contacts made using mechanically controllable break junctions, while controllable switching has been achieved recently using electromigration to grow or Shrink a nanobridge between two wires. A structural thinning process of the nanowire similar to the one described by the theory of Bürki et al. has been observed to take place for gold nanowires in TEM experiments. The nanowire was observed to thin step by step via a process where a structural step (corresponding to a change in radius of the order of one atomic diameter) forms at one end of the wire and subsequently propagates along the wire.

Nanowires suitable for the proposed device, i.e. with conductance between a few and a hundred conductance quanta, and lengths below or around a few nanometers have been realized experimentally using various techniques:

a. Scanning tunneling microscopy (STM) In this technique, a STM tip is crashed into a metal sample, thus forming a nanocontact. The size, and thus conductance, of the metal contact can then be adjusted to a predefined value by adapting the tip-sample distance. This technique has been shown to form relatively short wires down to atomically thin cross sections. However, it is sensitive to drift in the STM tip position, as well as to external vibrations. Furthermore, it is limited to metals which can be used to fabricate a sharp tip (Au, W, and other metals known in the art to be fabricable). However, a STM tip could be used to control strain on a longer, preformed nanowire, thus inducing conductance changes.

b. Mechanically controllable break-junction (MCBJ) With this technique, a macroscopic wire is glued to a support, itself mounted on a three-point bending device. A notch in the macroscopic wire provides a weak point where the wire breaks upon bending of the substrate. A nanocontact is formed, and its size can be controlled by adjusting the bending of the substrate. As for the STM technique, relatively short wires are formed, but the setup is more stable (i.e. less sensitive to external vibrations) and more versatile, as essentially any metal can be used. However, the need for such a three-point bending device, while allowing control of the strain applied to a nanowire, makes it difficult to have a fully nano-sized device.

c. Thin-film transmission electron microscopy (TEM) In contrast to the previous techniques, long wires can be formed by burning holes into a thin metallic film deposited on a substrate, using a strong electron irradiation. When two holes come close together, the irradiation intensity is decreased, switching the TEM to imaging mode, and a thin bridge is left, and is seen to self-assemble into a long, almost perfectly cylindrical wire. The nanowire thus formed is found to be suspended above the substrate, and has typically a diameter between half and a few nanometers, and a length of several nanometers. There is up to now little control on the final size of the wire, which is seen to be stable for seconds or longer at room temperature. As an alternative, a scanning electron microscope (SEM) could be used rather than TEM.

d. Electromigration and electrochemical fabrication. These two methods have been developed recently, and the wire size can be controlled in the former case by electromigration due to a voltage across the wire, or in the latter case by an electrochemical potential which controls etching from, or deposition on the wire through an electrolyte, while the presence of the electrolyte has been shown to have little influence on the stability and transport properties of the wire. Both methods have been shown to allow good control of the conductance of the wire. The electromigration technique has been generalized to create several contacts of similar size in parallel.

In order to change a nanowire configuration, several methods have been investigated: raising the temperature, applying strain and shortening the wire. For the purposes of a useful nanoscale device, these prior art methods are unsatisfactory for various reasons, principally having to do either with non-optimal operating conditions (temperature), or inability to implement these controls on the nanoscale (strain). However, none of the prior art methodologies described hereinbefore enables creation of stable nanowires which can be rapidly and controllably switched between different conductance states.

SUMMARY OF THE INVENTION

Variable resistors are commonly used circuit elements in many electronic applications. However, their large size and slow response time have heretofore limited their use primarily to the human-circuit interface. In order to establish a reliable nanoswitch for uses, such as, but not limited to, a nanoscale variable resistor and transistor, we describe herein the exploitation of quantum and stochastic effects at the nanoscale to allow one to combine what would ordinarily be distinct macroscale circuit elements into a single nanoscale device with multiple functionalities, and to achieve response times on the order of picoseconds.

These and other objects, advantages and features of the invention, together with the organization and manner of operation thereof, will become apparent from the following detailed description when taken in conjunction with the accompanying drawings.

BRIEF DESCRIPTION OF THE DRAWINGS

FIG. 6A: illustrates a device in cross-section of the invention using a solid dielectric and FIG. 6B shows a longitudinal cross-sectional view of FIG. 6A;

FIG. 7A: illustrates a cross-section view of a device of the invention using liquid dielectric in a cavity and FIG. 7B shows the device in a side view;

FIG. 9A: illustrates a cross-section view of a device of the invention using a solid dielectric with a top gate and FIG. 9B shows a longitudinal cross-section view of the device;

DETAILED DESCRIPTION OF PREFERRED EMBODIMENTS

Figure 1:
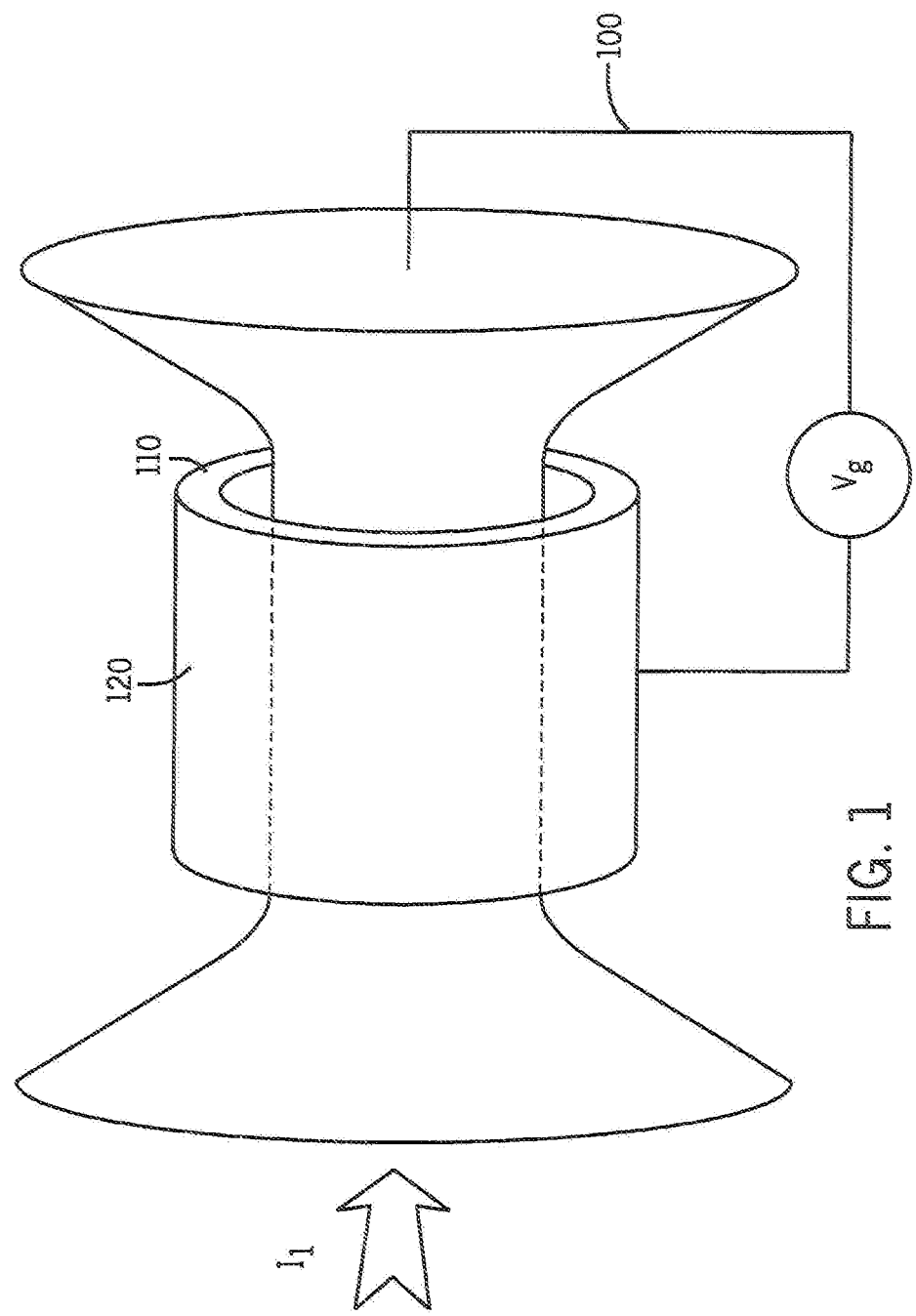
FIG. 1: illustrates a schematic diagram of a representative embodiment of the invention device.

In one embodiment of the invention, a device 90 is illustrated schematically in FIG. 1. A metal nanowire 100 is an active circuit element of the device 90 and is embedded in a dielectric sheath 110, surrounded by an outer conductor 120 of comparable dimensions, which is referred to hereinafter as the gate 120. In a preferred embodiment the gate 120 is coupled electrostatically to the nanowire 100 to effect switching. For optimal functionality, in a preferred embodiment, the dielectric constant $\in$ for appropriate dielectric materials should exceed approximately ten (example dielectric materials are, Si, Ge, InSb, InAs, InP, GaSb, or GaAs). The dielectric sheath 110 should preferably fill to the maximum extent possible the region between the nanowire 100 and the gate 120. A liquid dielectric form of the sheath 110 can be particularly suitable regarding both of these requirements, with e.g., water having a dielectric constant $\in$ which equals about 80. Alternately, a dielectric gel or sol-gel could be used. A positive/negative voltage applied to the gate 120 selectively can enhance/deplete the density of carriers in the nanowire 100. Importantly, the resulting shift in the Fermi energy $E_F$ alters the electron-shell structure of the nanowire 100, which in turn determines its stability.

Figure 2:
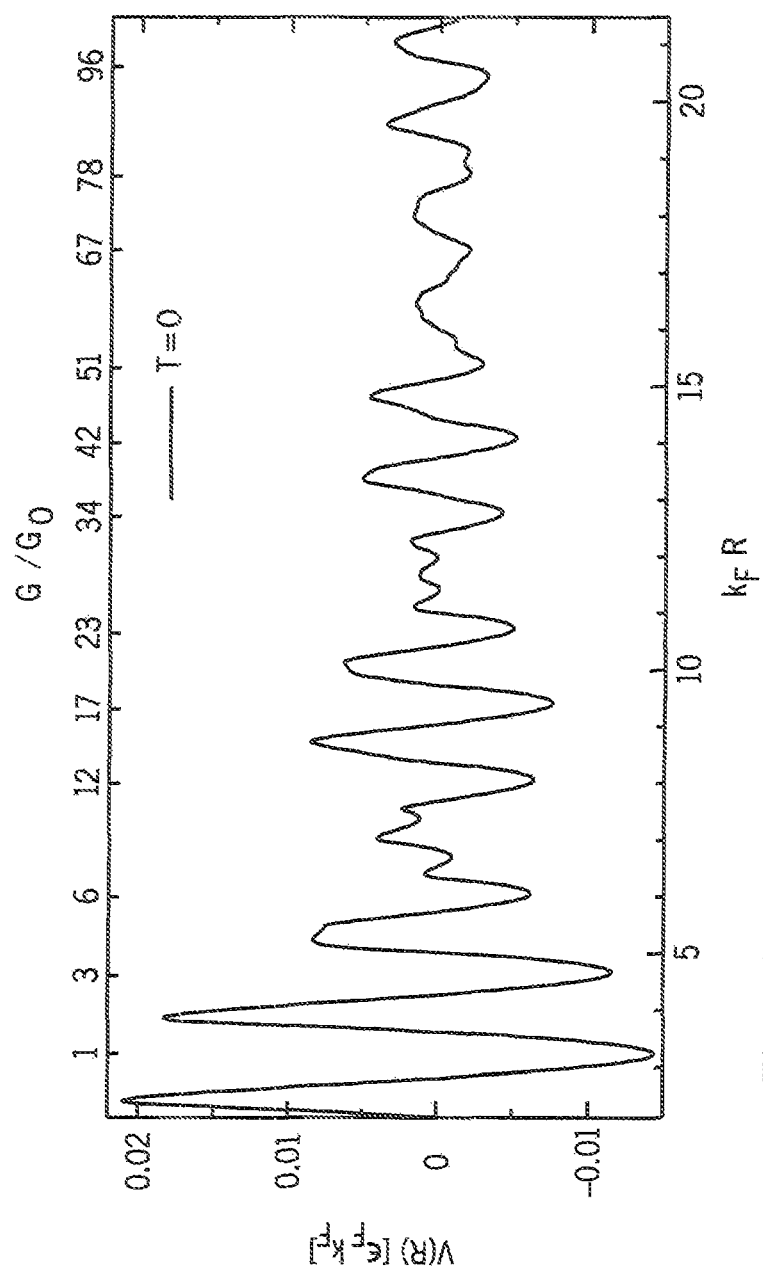
FIG. 2: illustrates electron-shell potential as a function of wire radius $k_F R$ wherein the conductance of the wires with "magic radii" is indicated on the top axis.
Figure 3:
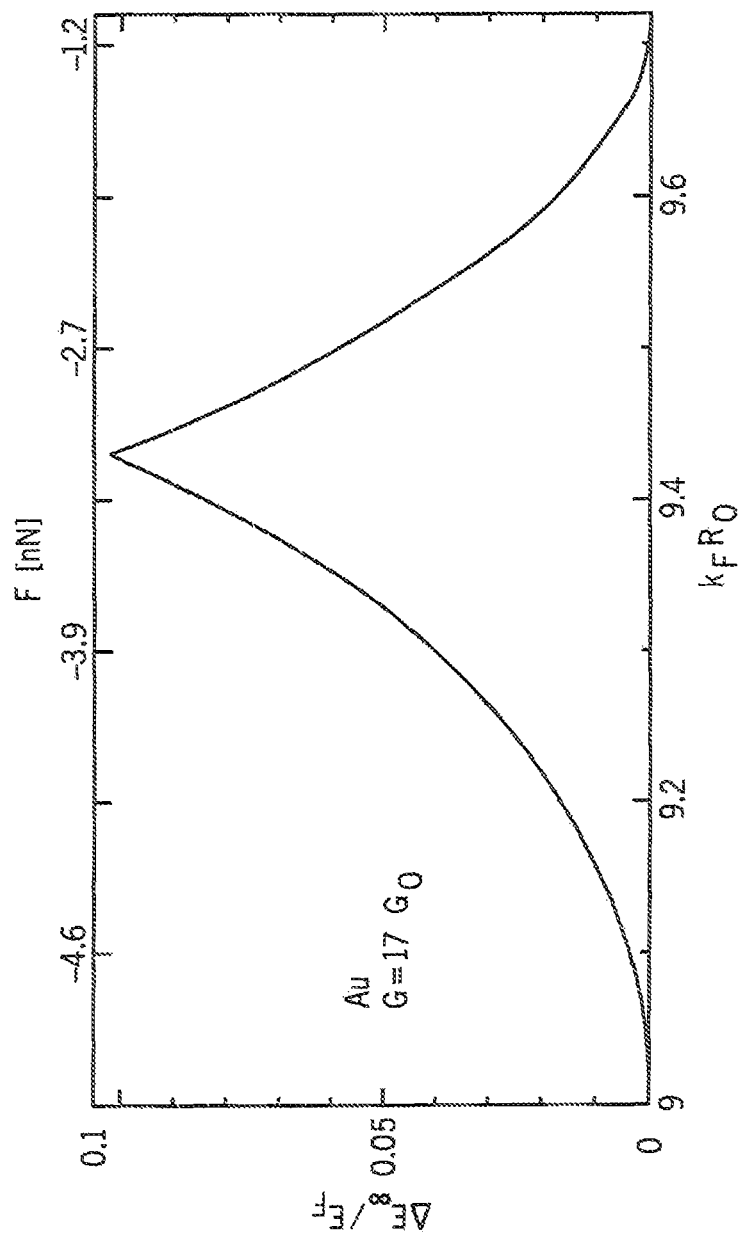
FIG. 3: illustrates calculated escape barrier as a function of wire radius $k_F R$ or equivalently applied stress F and results correspond to a gold wire with a conductance G=17 $G_0$.

The electron-shell potential is shown in FIG. 2; it exhibits several minima as a function of the dimensionless parameter $k_F R$, with $k_F$ the Fermi wavevector and R the wire radius. A shift in $k_F$ is thus analogous to applying strain, and can selectively be used to induce rapid (i.e., on the scale of the Debye frequency) transitions between neighboring magic radii. These have conductances differing by $nG_0$, where $n \geq 2$ is an integer (see FIG. 2). As a rule of thumb, the jumps between the electron shell potential minima scale as $n \sim (\pi/4)k_F R$ for a form of the wire 100 with initial radius R. The switching time between two adjacent "magic radii" (minima of the electron-shell potential) was shown to be given by the Kramers formula, $$\tau \sim \Gamma_0^{-1} \exp(\Delta E/k_B T), \quad (1)$$

where ΔE is the energy barrier, $k_B$ is Boltzmann's constant, and T is the temperature. The rate prefactor $\Gamma_0$, of order the Debye frequency, has been calculated in the prior art. The dependence of ΔE on the parameter $k_F R$ is illustrated in FIG. 3.

The possibility of shifting $E_F$ electrostatically, as described above, depends in an essential way on the crucial feature that the nanowire 100 has a radius of order nanometers, and thus has a very low density of states at $E_F$. As a function of the applied gate voltage $V_g$, the shift in $E_F$ is given by, $$\delta E_F = \frac{e \delta V_g}{1 + (e^2/C_g) dN/dE}, \quad (2)$$

where $C_g$ is the mutual capacitance between the gate 120 and the nanowire 100, and dN/dE is the density of states of the nanowire 100 at $E_F$. The denominator in Eq. (2) can be well approximated in terms of material and geometrical parameters, yielding a convenient rule-of-thumb estimate, $$\delta E_F \approx \frac{e\delta V_g}{1+\alpha r_x \in^{-1} G/G_0}, \quad (3)$$

where $r_s$ is the Fermi gas parameter for the nanowire material (essentially the mean inter-electron separation in the bulk metal), and $\alpha$ is a dimensionless parameter of order unity, which depends logarithmically on the device dimensions (see FIG. 1).

In order to achieve the maximum switching speed, it is necessary to achieve a shift. $\delta(k_F R)\sim 1$ in the shell-potential parameter. From Eq. (3), this implies a preferred operating gate voltage, $$\frac{eV_g}{E_F} \sim \frac{\alpha r_s k_F R}{6 \in}. \quad (4)$$

For typical metals, $r_s \sim 2$-3, while $k_F R \sim 10$ in the domain of validity of the nanoscale free electron model. In a most preferred embodiment, it is therefore desirable to use a dielectric with $\in \geq 10$ to minimize the necessary gate voltages.

Because the "mechanical" switching time of the nanoscale variable resistor can be as short as picoseconds, it can also be thought of as an electromechanical transistor. It is thus useful to establish its transconductance, a figure of merit used to characterize transistors. The transconductance $g_T$ can be estimated as $$g_T = \frac{dI_1}{dV_g} \sim \frac{nG_0 V_{12}}{V_g}. \quad (5)$$

Using Eq. (4) and $n \sim (\pi/4) k_F R$, one finds, $$\frac{g_T}{G_0} \sim \frac{3\pi \in}{2\alpha r_s} \frac{eV_{12}}{E_F}. \quad (6)$$

For large dielectric constants $\in \geq 10$, and bias voltages $V_{12} \sim 1V$, one can thus achieve $g_T \gg G_0$, an exceptional figure of merit for a nanoscale device, thereby enabling its advantageous use as an effective transistor. The device 90 discussed above is one where barriers are controlled by shifting the Fermi energy of the nanowire 100 through electrostatic means. In addition to the structural switching time of order picoseconds, the electrical RC rise time $t = C_g / G$ can be estimated to be of order 1 femtosecond for typical device dimensions/materials, and so is not a limiting factor in device performance.

Figure 4A:
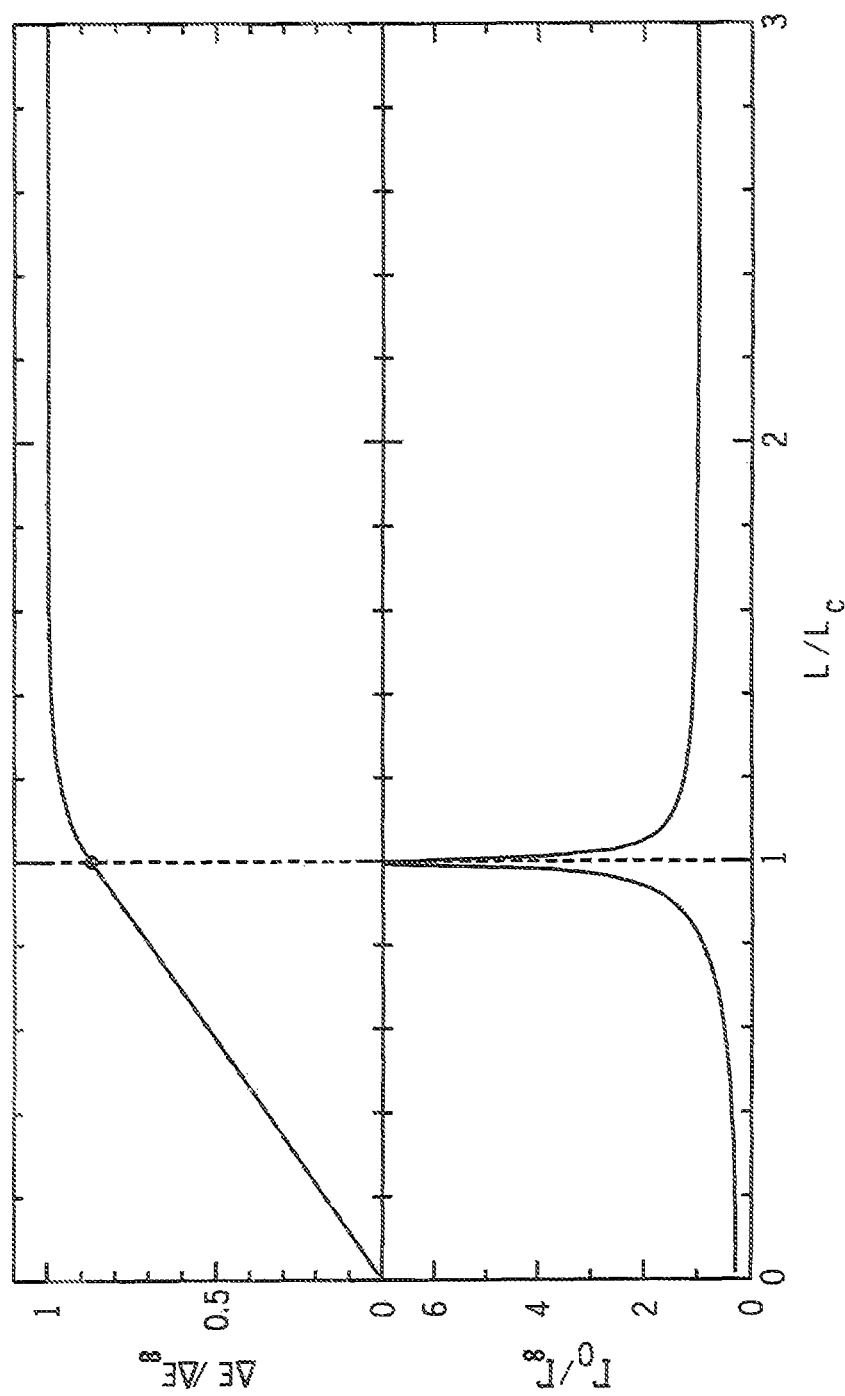
FIG. 4A: illustrates escape barrier ΔE (top) and prefactor $\Gamma_0$ (bottom) as a function of wire length and a second-order phase transition takes place at the critical length $L_c$ and for some wires, the transition is first-order (see inset FIG. 4B).
Figure 4B:
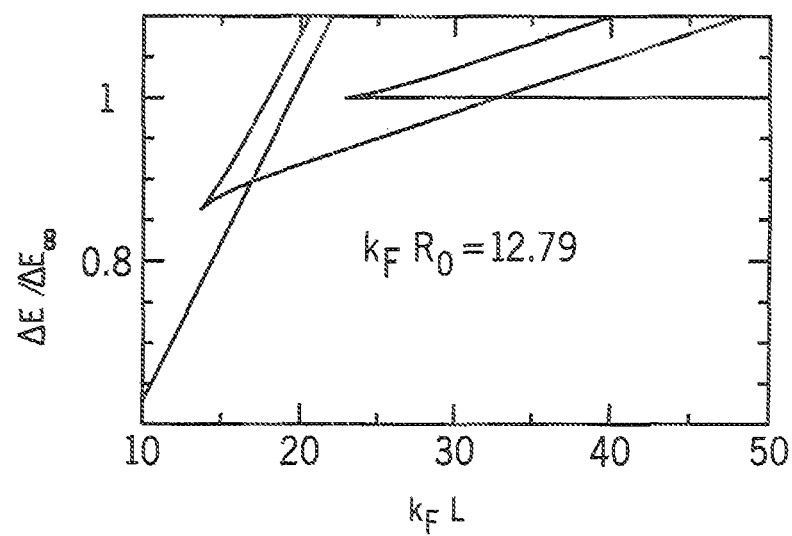
Figure 5A:
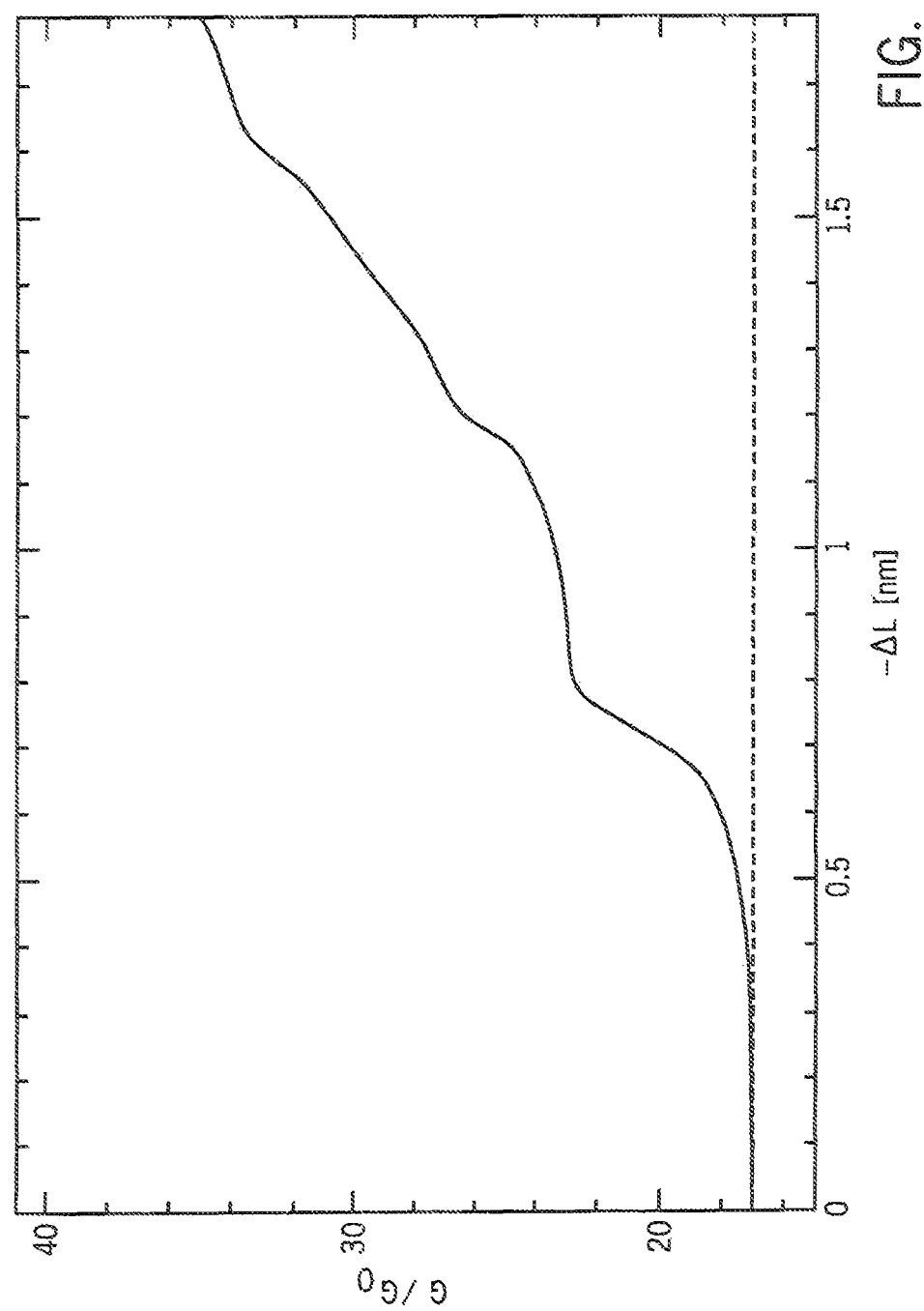
FIG. 5A: illustrates conductance of a short wire (solid line) and long wire (dashed line) under compression and the initial (left-hand-side) and final (right-hand-side) shapes of the long (B) and short (C) wires are shown in the inset FIG. 5B (long wire) and FIG. 5C (short wire)
Figure 5B:
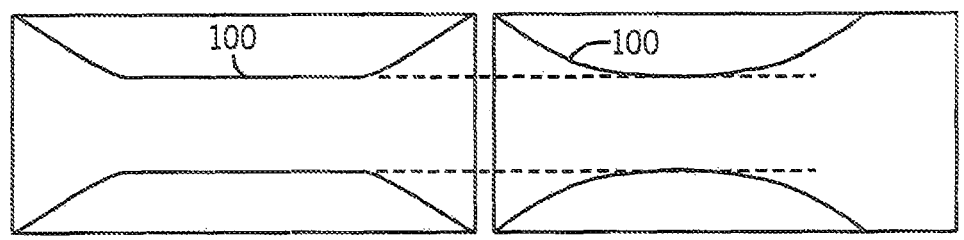
Figure 5C:
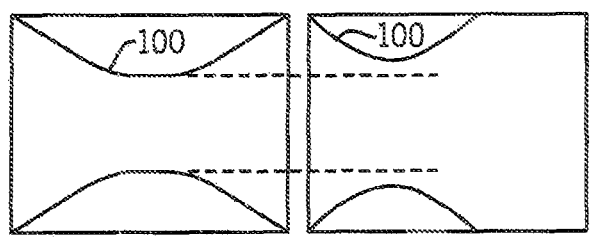

Another aspect of the invention can be shown by considering the changing of the wire length. A transition in activation behavior can occur as a function of wire length; below a critical length $L_c$, the barrier decreases rapidly with length, while above it is roughly constant. The transition can be continuous (second-order) or discontinuous (first-order) (see FIG. 4). This effect may have already been observed in a recent study which has reported a transition from linear to nonlinear I-V behavior in gold nanowires, as distance between electrodes shortened due to applied bias. We have been able to explain this result as a consequence of the transition in radius stability as a function of wire length (see FIG. 4). This observation leads to another device possibility, namely changing wire length directly by changing the applied voltage. This would convert the wire 100 with linear I-V characteristics to one with nonlinear ones. This is illustrated in FIGS. 5A-C which shows a model calculation of the wire shape and conductance during compression. FIG. 5B shows a wire whose length exceeds the critical length $L_c$; under compression (e.g. due to heating of the contacts under finite bias) its radius is stable, and its conductance (shown as a dashed line in FIG. 5A) remains constant. FIG. 5C shows a shorter wire whose length is close to $L_c$; its radius is unstable and increases under compression, together with the wire conductance shown as a solid, line in FIG. 5A.

In a preferred embodiment, commercial fabrication of the nanoscale variable resistor/electromechanical transistor device 90 includes combining the three components of the device 90, the metal nanowire 100, the dielectric sheath 110, and the gate 120 and integrated with other circuitry on a chip (not shown). Accordingly, in one preferred embodiment of the current invention, the production of the nanoscale circuitry is based on performing the following four (4) steps:

Step 1: The initial structure of the nanowire 100, including its electrical connection to the rest of an integrated circuit 130 (see FIG. 1), can be formed with standard semiconductor fabrication and patterning processes such as for example E-beam direct write, or alternatively in the long term masked ion beam lithography, to deposit a metal wire tens of nanometers in diameter on the substrate (e.g., a Si wafer or other insulating substrate). Suitable example metals for nanowire formation include Au, Ag, Cu, Pt, and Al, among others. Any elemental metal (not alloy) of sufficient stability, and sufficiently ductile can be used to form nanocontacts.

Step 2: To form an active form of the device 90, a short section of the nanowire 100 preferably is thinned down to a diameter of order one nanometer using one of the known nanowire fabrication techniques outlined above, such as a focused scanning electron microscope (SEM), electromigration, or chemical etching.

Step 3: The active segment of the nanowire 100 is encased in the dielectric sheath 110, which also serves to passivate the nanowire surface, increasing durability.

Step 4: Finally, the nanowire 100 encased in the dielectric sheath 110 is placed in proximity to one or more of the metal gates 120 which is used to control the nanowire resistance through induced structural transitions.

In a most preferred embodiment, to achieve optimal device characteristics, the space around the active segment of the nanowire 100 should be filled with the dielectric sheath 110 having $\in \geq 10$. If a solid form of the dielectric sheath 110 (only) is used, a small gap 210 around the active segment of the nanowire 100 is provided (see FIG. 6B) to permit the nanowire surface to fluctuate freely. FIGS. 6A and 6B are two different views of the same device. The wire fills the gap in FIG. 6A because the cross section shows the thicker part of the wire, which hides the thinner part, both of which are visible in FIG. 6B. In that case, the mean dielectric constant of the region between the nanowire 100 and the gate(s) 120 on substrate 150 (including the gap) should preferably exceed ten. Many intrinsic semiconductors could serve as suitable solid dielectrics with $\in \geq 10$ (e.g., Si, Ge, InSb, InAs, InP, GaSb, or GaAs). The material should be chosen so that the semiconducting energy gap exceeds the maximum desired voltage difference between the gate 120 and the nanowire 100. Appropriate choice of materials enables advantageous use of the device 90 for transistors and variable resistors.

In another preferred embodiment shown in FIGS. 7A and 7B, a liquid dielectric or combination of solid and liquid dielectrics 110 and 110', respectively, can be placed between the active segment of the metal nanowire 100 and the gate(s)

120. This would allow for optimal filling of the dielectric sheath 110 and 110', while still permitting free motion of the nanowire surface. Liquid dielectrics have been used in conjunction with some of the previous techniques, in the context of single molecule measurements, as well as for STM measurements of metal contact transport. In the latter context, they have been shown to have little influence on the stability and transport properties of the nanocontact, Liquid dielectrics can have large dielectric constants and, being liquids, would easily adapt to the shape of the nanowire 100, without preventing its deformation. They are thus ideal candidates for the proposed device 90. For example, the dielectric constant of water at room temperature is close to 80. While the finite conductivity of water might be problematic, deionized, water still has a dielectric constant of 15. As another example, glycerol has a dielectric constant above 40. Various oil-based dielectrics [see e.g., U.S. Pat. No. 413,189 which is incorporated by reference herein] have been developed and could be suitable for the device 90. In another preferred embodiment, a dielectric gel or sol-gel or a combination of solid and gel dielectrics can be placed between the active segment of the nanowire and the gate(s).

Examples of specific types of the nanowire device 90 are provided below. It is important to note that the device architectures described in the examples are generic in nature, and do not constitute the exclusive embodiments of the invention.

Example 1

In one embodiment of the present invention (see FIGS. 6A and 6B), a solid layer of the dielectric sheath 110 is deposited on a substrate 150 which has been prepatterned (using standard vapor deposition techniques) with the metallic gate 120 to address the nanowire device 90. The metal nanowire 100 of uniform diameter several tens of nanometers is then deposited on the surface of the dielectric sheath 110, in alignment with the submerged electrode forming the gate 120. This fabrication step can be carried out within standard semiconductor patterning techniques, such as for example E-beam direct write or alternatively in the long term masked ion beam lithography. A further layer of solid dielectric 170 is then deposited on the dielectric sheath 110 fully encasing the nanowire 100 (see FIGS. 6A and 6B). A nanoscale pit or cavity 210 is then etched in the layer of the dielectric 170, exposing the active segment of the nanowire 100 (see FIGS. 6B and 9B). The exposed segment of the nanowire 100 is then thinned down to the specified diameter (of order one nanometer) via e.g., focused SEM, chemical etching, or electromigration, or a combination of these techniques.

A hermetic seal can be applied to increase the durability of the nanowire device 90. In one embodiment, a bubble seal (not shown) is used to enclose an inert atmosphere (e.g., nitrogen or argon) about the exposed segment of the nanowire 100. An epoxy seal for example could be used. Alternatively, in one embodiment, a conventional passivation layer (not shown) over the nanowire device 90 is used to scavenge any small amounts of oxidant from the sealed environment.

Example 2

In another embodiment (see FIGS. 7A and B), a solid layer of the dielectric sheath 110 is deposited on a substrate 150 prepatterned with a metallic form of the gate 120 to address the nanowire device 90. A metal nanowire 100 of uniform diameter several tens of nanometers is then deposited on the surface of the dielectric sheath 110, in alignment with the submerged electrode gate 120. This fabrication step can be carried out within standard semiconductor patterning techniques, such as for example E-beam direct write or alternatively in the long term masked ion beam lithography. A further layer 170 of solid dielectric is then deposited, as further shown in FIGS. 6A, 6B, 7A, 7B and 9A, fully encasing the nanowire 100. A nanoscale pit or cavity is then etched in the dielectric layer 110, exposing the active segment of the nanowire 100. The exposed segment of the nanowire 100 is then thinned down to the specified diameter (of order one nanometer) via e.g., focused SEM, chemical etching, or electromigration, or a combination of these techniques.

The nanoscale pit is then filled with liquid dielectric 110', and a sealing cap 160 is applied to the device 90, sealing the liquid dielectric in the pit with the nanowire 100. In this embodiment, several such devices on one chip 200 of the device 90 could be simultaneously sealed with a single sealing cap 160.

Example 3

In one embodiment of the device 90, a layer of the solid dielectric sheath 110 is deposited on a substrate 150 prepatterned with a metallic form of the gate 120 to address the nanowire device 90. A metal nanowire 100 several tens of nanometers in diameter with a "notch" or constriction at the desired location is then deposited on the surface of the dielectric sheath 110, in alignment with the submerged electrode gate 120. This example is similar to that illustrated in FIGS. 6A and 6B, but without the additional dielectric layer 170. The nanowire 100 at the notch can then be thinned down to the specified operating diameter by electromigration. TEM, or chemical etching. The nanowire device 90 can then be sealed for durability as described above in Example 1.

Example 4

Figure 8B:
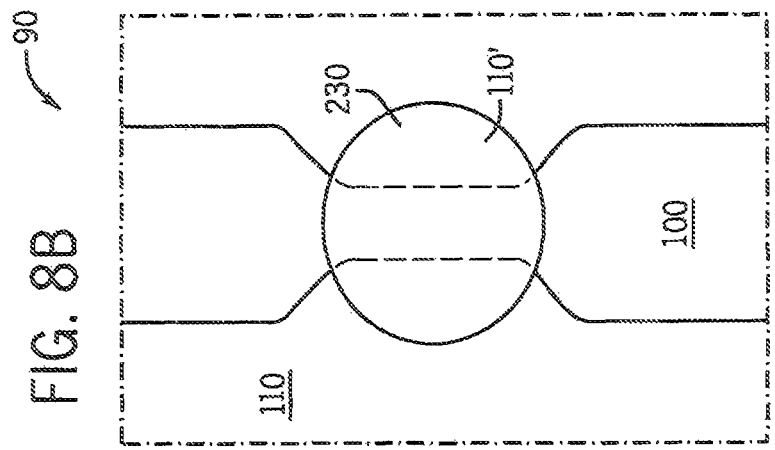
FIG. 8B shows a top view of the device.
Figure 8A:
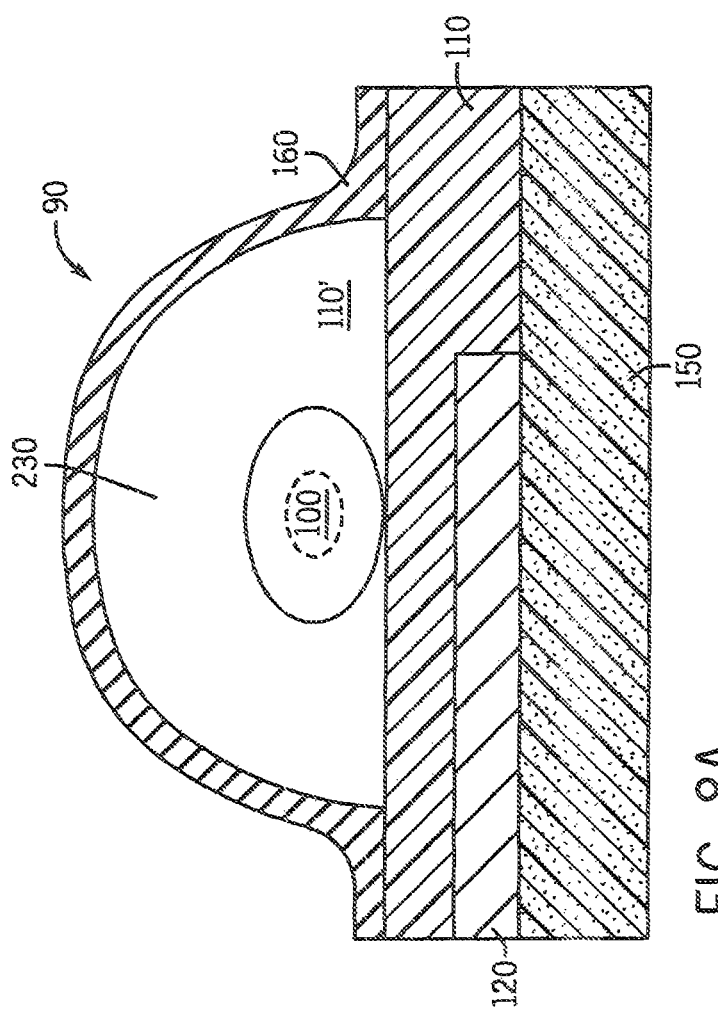
FIG. 8A: illustrates a cross-section view of a device of the invention using a drop of liquid dielectric

In another embodiment of the present invention, a solid layer form of the dielectric sheath 110 is deposited on the substrate 150 prepatterned with a metallic form of the gate 120 to address the nanowire device 90. The metal nanowire 100 several tens of nanometers in diameter with a "notch" or constriction at the desired location is then deposited on the surface of the dielectric sheath 110, in alignment with the submerged electrode gate 120. The nanowire 100 at the notch can then be thinned down to the specified operating diameter by electromigration, TEM, or chemical etching. (Various ones of the figures (FIGS. 6A-9B) show the finished device 90, where the notched nanowire 100 has been thinned down.) A nanodroplet 230 in liquid form for the dielectric sheath 110 is then deposited on the surface of the wafer substrate 150, immersing the nanowire device 90 (see FIGS. 5A and 8B). The nanowire device 100, together with the droplet 230, is then hermetically sealed, e.g., with an epoxy seal 160.

Example 5

In one embodiment of the present invention (see FIGS. 9A and 9B) both a top gate 120' and a bottom gate 120 are included, above and below the nanowire device 90, respectively. The fabrication proceeds as described in the examples above, but an additional dielectric sheath layer 240 is deposited above the nanowire device 90, and the top gate 120' aligned with the device 90 is patterned by e.g., vapor deposition. Multiple gates may be desirable e.g. to address individual devices in a large array. For example, if the gate voltage is chosen appropriately, the device 90 will switch conducting states rapidly only if the voltage is applied to both gates.

Because the three terminals of the nanoscale variable resistor are comprised of metal patterned by standard semiconductor fabrication techniques, such devices can be readily integrated with conventional circuitry on a chip. Because the throughput impedance of such a device 90 is on the scale of several hundred to several thousand Ohms, appropriate amplification may be required to interface with standard CMOS circuitry.

Figure 10:
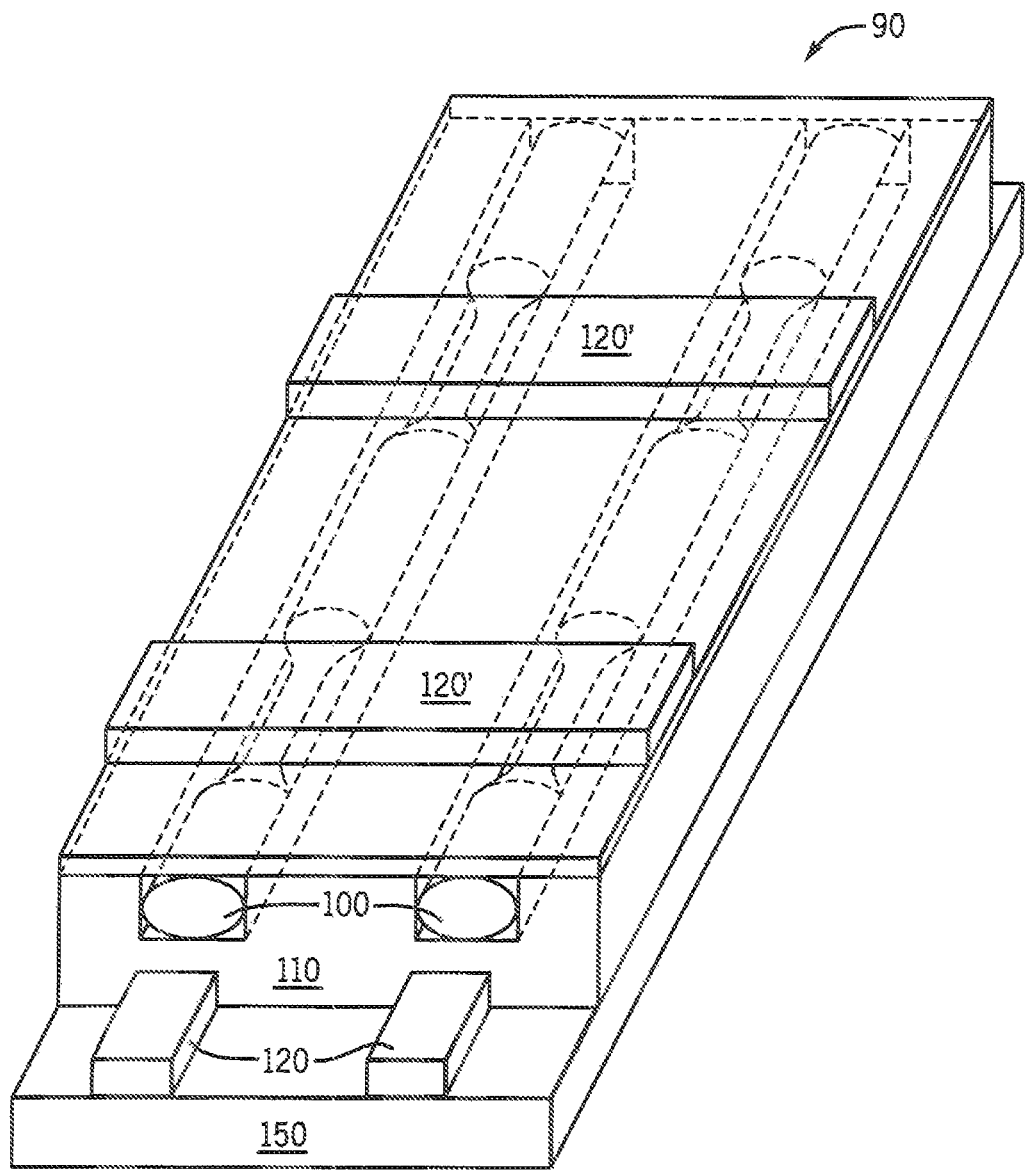
FIG. 10; illustrates an array of devices with top and bottom gates.
Figure 11:
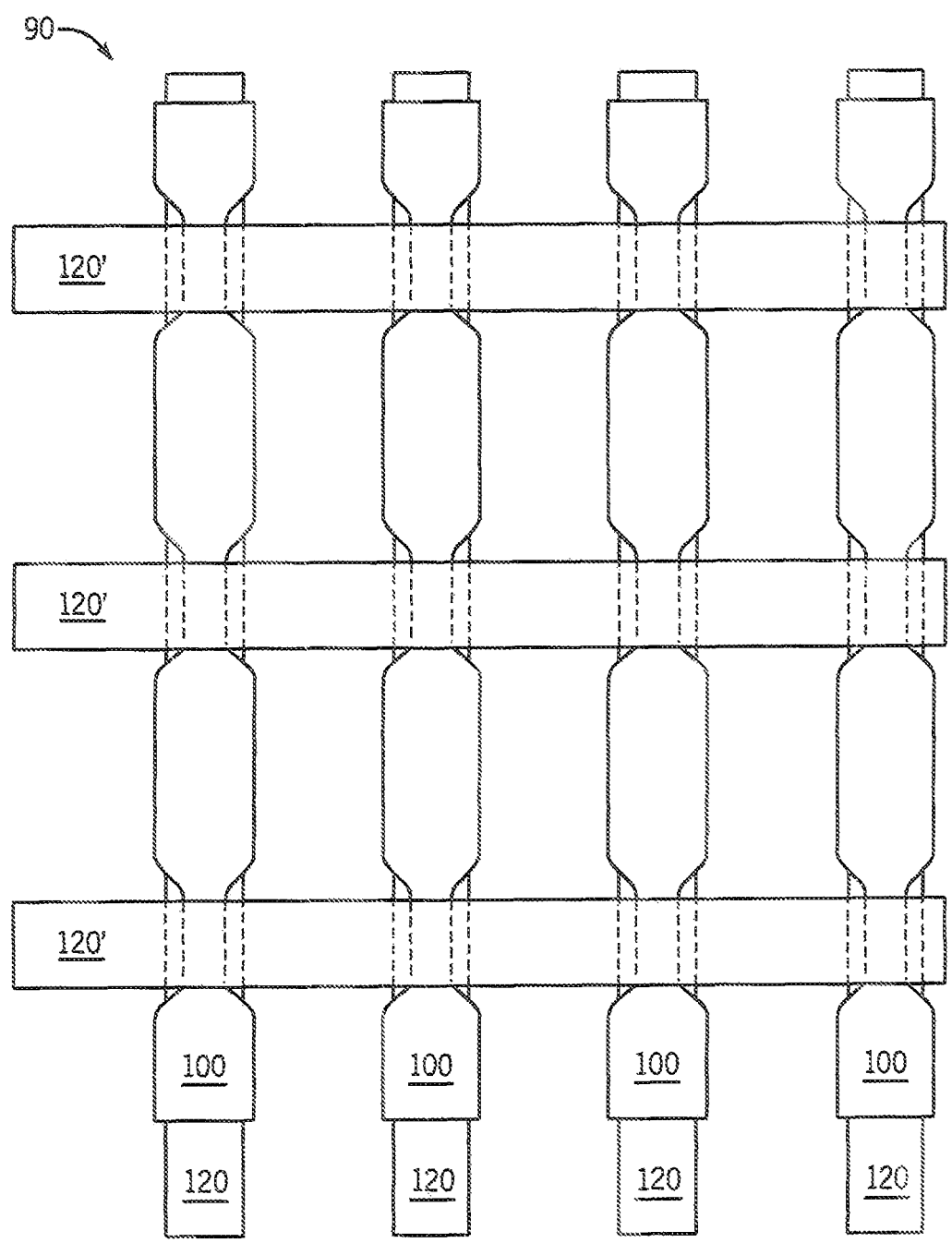
FIG. 11; illustrates an array of devices with top and bottom gates (top view)
Figure 12:
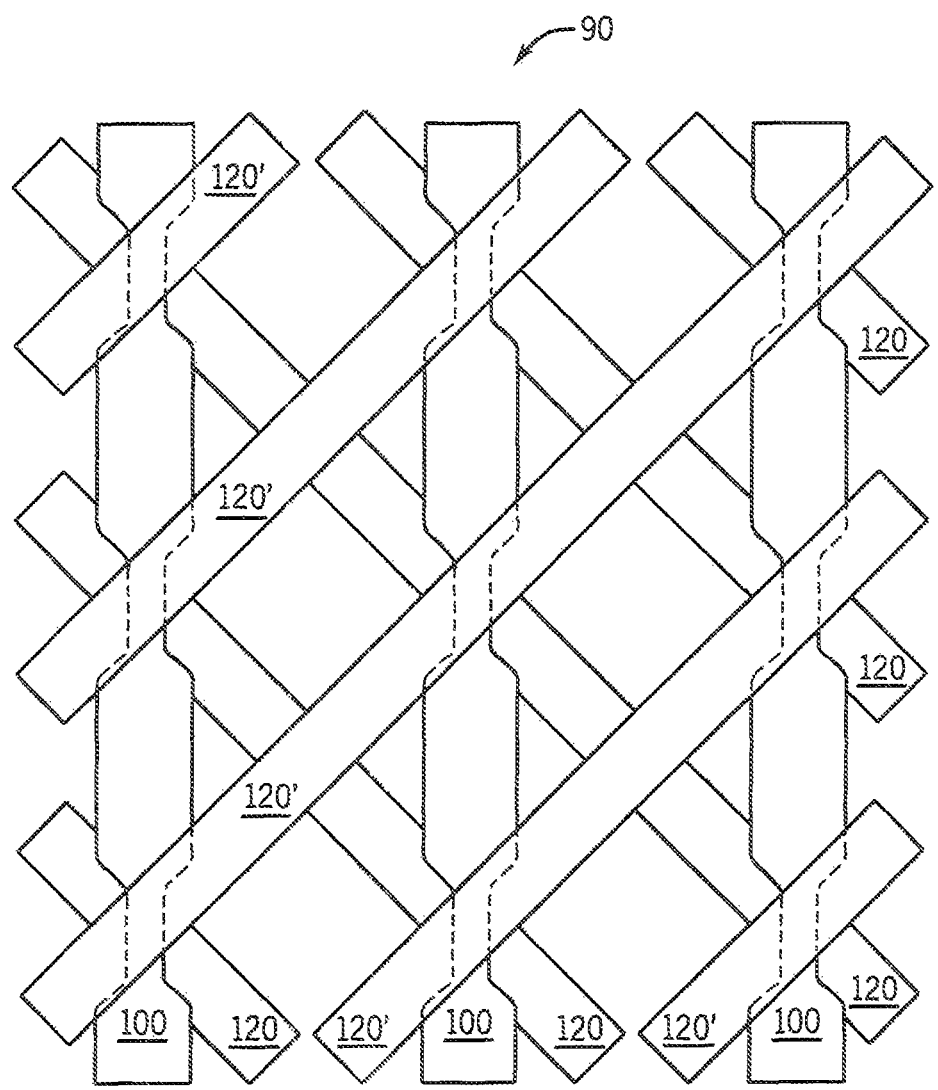
FIG. 12: illustrates an alternate embodiment of an array of devices with top and bottom gates (top view).

In order to individually address distinct devices in a large array on a chip, it may be desirable to fabricate a crisscrossing pattern of the top gate 120 and bottom gate 120 (see FIGS. 10, 11, and 12). With an appropriate choice of operating voltages, only the nanowire device 90 located at the intersection of the two active gates 120 and 120' is addressed, and caused to switch conducting states.

While preferred embodiments have been illustrated and described, it should be understood that changes and modifications can be made therein in accordance with one of ordinary skill in the art without departing from the invention in its broader aspects. Various features of the invention are defined in the following claims.

What is claimed is:

1. A nanodevice for use in an electrical circuit, comprising:
   a dielectric having a dielectric constant;
   a nanowire coupled the dielectric; and
   a gate disposed about at least a portion of the dielectric and coupled to the nanowire for activating change of state for the nanowire, thereby enabling use of the nanowire in an electronic circuit
   wherein the nanowire has a length which is changeable to achieve selectable I-V behavior.

2. The nanodevice as defined in claim 1 wherein the dielectric constant of the dielectric is greater than about 10.

3. The nanodevice as defined in claim 2 wherein the dielectric is selected from the group consisting of Si, Ge, InSb, InAs, InP, GaSb and GaAs.

4. The nanodevice as defined in claim 1 further including a voltage source for applying a potential to the nanowire to change the length.

5. The nanodevice as defined in claim 1 further including a circuit coupled to the nanodevice.

6. The nanodevice as defined in claim 5 wherein the circuit comprises an integrated circuit.

7. The nanodevice as defined in claim 1 wherein the dielectric comprises a sheath disposed about the nanowire and a gap positioned between the dielectric sheath and the nanowire.

8. The nanodevice as defined in claim 1 wherein the dielectric comprises a sheath disposed about the nanowire and has no gap between the dielectric sheath and the nanowire.

9. The nanodevice as defined in claim 7 wherein the dielectric constant is a combination of the dielectric constants of the dielectric sheath and the gap and the dielectric constant is at least about 10.

10. The nanodevice as defined in claim 1 wherein the dielectric comprises a liquid.

11. The nanodevice as defined in claim 10 wherein the liquid is selected from the group consisting of deionized water, glycerol and an oil.

12. The nanodevice as defined in claim 1 wherein the gate comprises a metal.

13. The nanodevice as defined in claim 1 wherein the dielectric comprises at least one of a gel and a sol-gel.

14. A method of switching a nanodevice comprising,
    providing a nanowire coupled to a dielectric;
    providing a gate coupled to the nanowire; and
    applying a voltage through the gate to the nanowire to change an electron shell parameter of the nanowire, thereby causing switching of the nanodevice.

15. The method as defined in claim 13 wherein the applied voltage comprises an operating gate voltage $V_g$ of about $$\frac{eV_g}{E_F} \sim \frac{\alpha r_s k_F R}{6 \epsilon}$$

to achieve rapid switching.

16. The method as defined in claim 15 wherein the electron shell parameter is changed selectively, thereby enabling switching between different radii for the nanowire which changes electrical operating state for the nanowire.

17. The method as defined in claim 15 wherein the gate voltage is selected from a group of a positive voltage to enhance density of carriers in the nanowire and negative voltage to deplete the density of carriers in the nanowire.

18. The method as defined in claim 14 wherein the nanowire has a length which is changed by applying a selected voltage, thereby converting the nanowire I-V characteristics to nonlinear behavior.

19. The method as defined in claim 14 further including the step of providing the dielectric as a combination of a liquid and solid dielectric, thereby enabling free motion of a surface of the nanowire with respect to the dielectric.

20. The method as defined in claim 14 wherein the coupling between the nanowire and the dielectric comprises a direct contact.

21. A nanodevice for use in an electrical circuit, comprising:
    a dielectric having a dielectric constant;
    a nanowire coupled to the dielectric; and
    a gate disposed about at least a portion of the dielectric and coupled to the nanowire for activating change of state for the nanowire; thereby enabling use of the nanowire in an electric circuit;
    wherein the nanowire has an electron shell system parameter that is changeable upon application of a voltage through the gate to control switching of the nanodevice.

22. The nanodevice as defined in claim 21 wherein the dielectric constant of the dielectric is greater than about 10.

23. The nanodevice as defined in claim 21 wherein the dielectric comprises a sheath disposed about the nanowire and a gap positioned between the dielectric sheath and the nanowire.

24. The nanodevice as defined in claim 21 wherein the dielectric comprises a sheath disposed about the nanowire and has no gap between the dielectric sheath and the nanowire.

25. The nanodevice as defined in claim 23 wherein the dielectric constant is a combination of the dielectric constants of the dielectric sheath and the gap and the dielectric constant is at least about 10.

26. The nanodevice as defined in claim 21, wherein the nanowire is an elemental metal.

27. The nanodevice as defined in claim 26, wherein the elemental metal comprises a noble metal.

28. The nanodevice as defined in claim 26, wherein the nanowire is convertible between linear I-V behavior and nonlinear I-V behavior.

29. The nanodevice as defined in claim 27, wherein the nanowire is convertible between linear I-V behavior and nonlinear I-V behavior.

* * * * *